United States Patent [19]

Backes

[11] Patent Number: 4,518,951
[45] Date of Patent: May 21, 1985

[54] INTEGRATED CIRCUIT FOR A KEYBOARD OF AN ELECTRONIC APPARATUS

[75] Inventor: Reiner Backes, Freiburg, Fed. Rep. of Germany

[73] Assignee: ITT Industries, Inc., New York, N.Y.

[21] Appl. No.: 391,617

[22] Filed: Jun. 24, 1982

[30] Foreign Application Priority Data

Jul. 10, 1981 [EP] European Pat. Off. ........ 81105385.9

[51] Int. Cl.³ .............................................. G06F 3/02
[52] U.S. Cl. .............................. 340/365 S; 178/17 C; 340/365 R
[58] Field of Search ............ 340/365 S, 365 E, 365 R; 178/17 C; 179/90 K

[56] References Cited

U.S. PATENT DOCUMENTS

| | | | |
|---|---|---|---|
| 3,715,746 | 2/1973 | Hatano | 340/365 S |
| 3,717,871 | 2/1973 | Hatano | 340/365 S |
| 3,950,743 | 4/1976 | Hatano | 340/365 S |
| 4,051,471 | 9/1977 | Hatano | 340/365 S |
| 4,318,087 | 3/1982 | Wilson | 340/365 S |

Primary Examiner—James J. Groody
Attorney, Agent, or Firm—Donald J. Lenkszus

[57] ABSTRACT

This circuit, controlled by the counter (Z) and via the row transistors (ZTm) and upon actuation of a pushbutton key, successively interrogates the row lines (1m) and, via the column line (2n) as connected to the row line, forms an inverter with the corresponding resistor (SRn), so that an L level will appear at the input of the corresponding column inverter (SI1n). In the ROM-type matrix (M), with the aid of the matrix transistors (T . . . ) and the resistors (MRmn) it is accomplished that the m·n lines (Lmn) are only controlled in such a way that the corresponding line conducts an H level upon actuating only one single pushbutton key of the keyboard (TF). Accordingly, a 1-ex-m-times-n code appears on the lines (Lmn) which, via the NOR gate (N) also effects the release of the counter (Z) counting the clock pulses of the clock pulse generator (TG).

2 Claims, 2 Drawing Figures

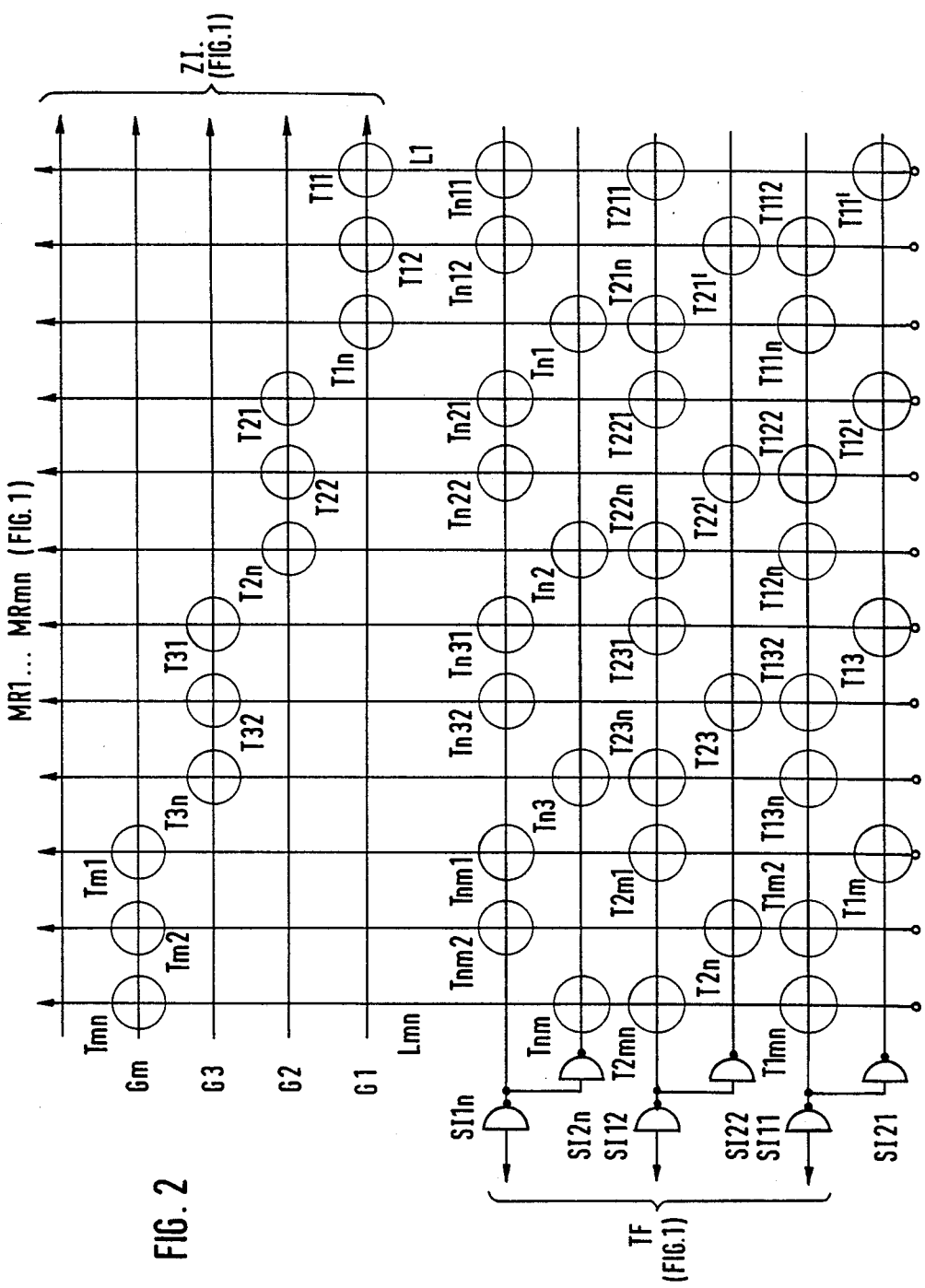

INTEGRATED CIRCUIT FOR A KEYBOARD OF AN ELECTRONIC APPARATUS

BACKGROUND OF THE INVENTION

The invention relates to an integrated circuit for a keyboard of electronic apparatus, comprising pushbutton keys arranged in n columns and m rows, each pushbutton key having two terminals and, when being actuated, directly connects one column line associated with the respective column, to one row line associated with the respective row, with each column line being temporarily connected to the input of a first column inverter and, across a first resistance element, to a constant potential, with each row line, via the clocked current path of a row transistor, being connected to the zero point of the circuit, with a row inverter being associated therewith. An example of such a circuit is disclosed in the German Offenlegungs/Auslegeschrift DE No. 28 54 934 A1/B2 corresponding to U.S. Pat. No. 4,266,213.

In the conventional arrangement the resistance elements associated with each column line, are connected to the zero point of the circuit, and the first column inverters are connected to the respective column line via electronic switches which are periodically opened and closed by a clock signal, so that they are only temporarily connected to one another while the switches are closed. Moreover, in the conventional arrangement one row inverter each is associated with the individual row lines, which are likewise only temporarily in connection with the row lines, i.e., when the electronic switches which are controlled by a clock signal which is inverse in relation to the aforementioned clock signal, are closed. The conventional arrangement operates statically when at normal, hence when the pushbutton keys are not depressed, and operates dynamically when a pushbutton key is depressed, with the number of employed components being very small. Moreover, with respect to the columns, the conventional arrangement supplies a 1-ex-n-coded signal and, with respect to the rows, a 1-ex-m-coded signal.

SUMMARY OF THE INVENTION

In certan cases of practical application, however, it is necessary to produce a 1-ex-m-times-n-coded signal. It is the object of the invention, to provide an integrated circuit which provides a 1-ex-m-times-n-coded signal which is likewise supposed to suffice with a minimum number of components. An advantage of the invention resides in the fact that the employed matrix with the matrix transistors arranged at the marked points, has the structure of a read-only memory (ROM), so that this matrix, especialy when integrated by employing insulated-gate field-effect transistors, can be produced in a particularly space-saving manner.

BRIEF DESCRIPTION OF THE DRAWINGS

The invention will now be explained in greater detail with reference to FIGS. 1 and 2 of the accompanying drawings, in which.

DETAILED DESCRIPTION OF THE INVENTION

Figure 1:
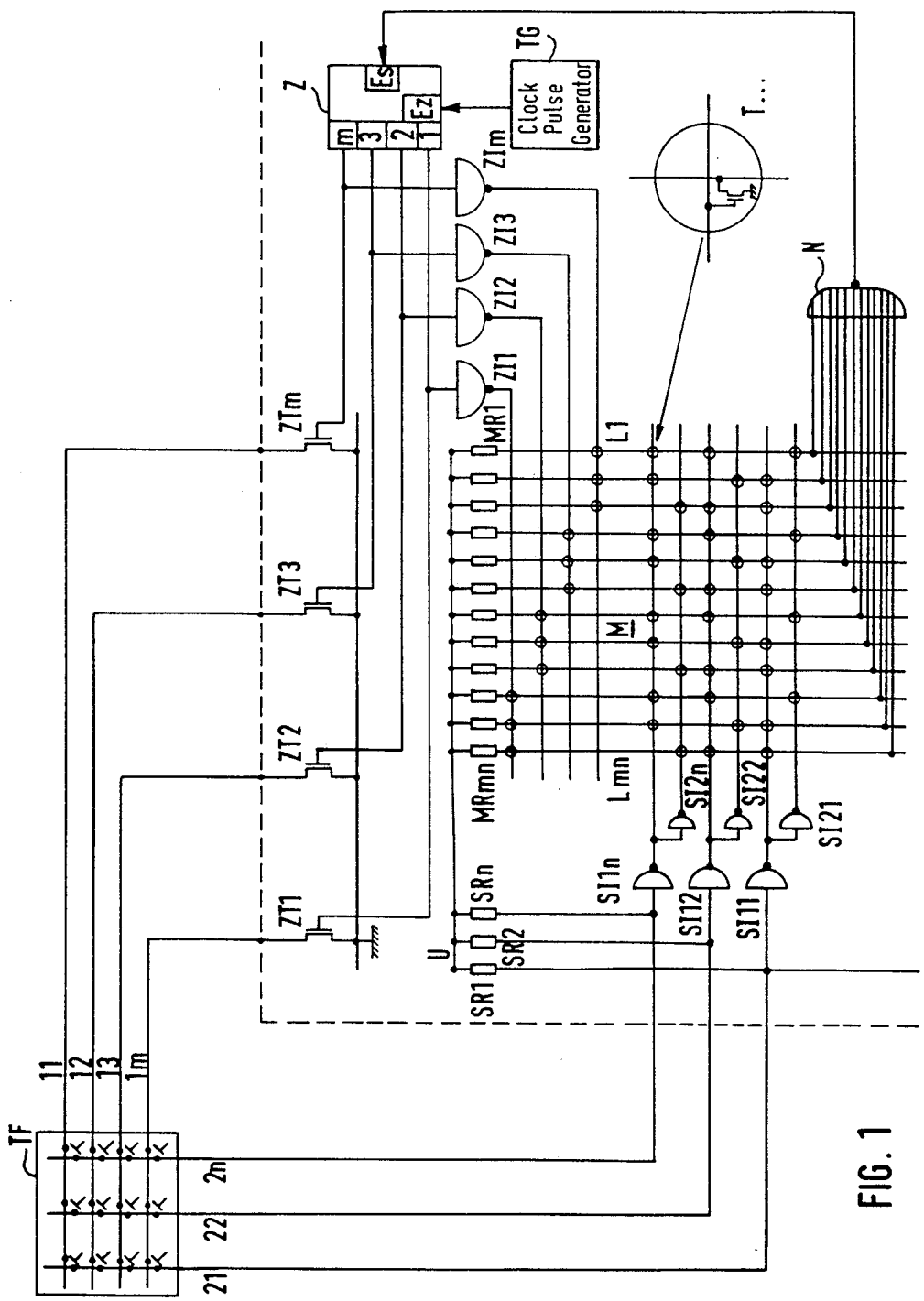
FIG. 1, in a partially schematical representation, shows the circuit diagram relating to an example of embodiment of the invention, and FIG. 2, on an enlarged scale, shows the matrix provided for in FIG. 1.

FIG. 1 shows a keyboard TF comprising m row lines 11, 12, 13, 1m and n column lines 21, 22, 2n with m=4 and n=3. At the respective intersecting points each time one pushbutton key is arranged in the conventional manner with this key, when depressed, directly connecting the respective row line to the respective column line.

The respective row line 11, 12, 13 1m is connected via the clocked current path of the associated row transistor ZT1, ZT2, ZT3, ZTm to the zero point of the circuit. The row transistors ZTm are connected to the counter reading outputs 1, 2, 3, m of the counter Z, with the counting input Ez thereof being connected to the output of the clock pulse generator TG. Accordingly, the row transistors ZTm are successively switched to conducting state by the counter reading outputs m. On account of this, whenever the row line 1m and the column line 2n are connected to one another, for example, upon actuation of a pushbutton key, the corresponding row transistor ZT1 is connected together with a first resistance element SR1, to an inverter, and the potential at the connecting point thereof is applied to that of the zero point of the circuit (=L level).

One such resistance element SRn is associated with each column line 2n, hence the resistance elements SR1, SR2, SRn are associated with the column lines 21, 22, 2n. The column lines 2n are also each time connected to the input of the second column inverter SI21, SI22, SI2n.

The counter reading outputs 1 ... m of the counter Z are also connected to the inputs of the respective row inverters ZI1, ZI2, ZI3, ZIm. Moreover, there is provided the matrix M consisting of m line groups G1, G2, G3, Gm (cf. FIG. 2), with each of said line groups G having n matrix lines. Accordingly, in FIGS. 1 and 2 there are shown 12 such matrix lins L1 ... Lmn; these are connected across the second resistance elements MR1, MRmn to the operating voltage U. At these matrix lines there appears the output signal, hence the 1-ex-m-times-n code.

The outputs of the row inverters ZIm are each connected to the gates of matrix transistors, across the controlled current path of which the associated second resistance element MRmn is connected to the zero point of the circuit, with each time one line group Gm belonging to each row inverter ZIm. In the example of embodiment as shown in FIGS. 1 and 2, in which n=3, it will be seen that, accordingly, to each row inverter there belong three matrix transistors T ... in each line group Gm. Accordingly, with respect to the line groups G1, G2, G3, Gm, FIG. 2 shows the matrix transistors T11, T12, T1n; T21, T22, T2n; T31, T32, T3n; Tm1, Tm2, Tmn.

In a similar way, the outputs of the first and the second column inverters SI1n, SI2n are connected, via further matrix transistors, to the line groups Gm. The regularity of this connection resides in that the output of each second column inverter SI2n is connected to the gate of a further matrix transistor correspondingly belonging to a line group Gm. From FIG. 2 it can be seen that the output of the second column inverter SI21 belonging to the first column line 21, is respectively connected in the line groups G1 ... Gm, to the first line, and thus controls the matrix transistors T11', T12', T13, T1m. In a similar way, the second column inverter SI22 as belonging to the second column line 22, and via the second line in the line groups G1 . . . Gm, controls the matrix transistors T21', T22', T23, T2n, while the second column inverter SI2n as associated with the n-th column line 2n, selects the matrix transistors Tn1, Tn2, Tn3, Tnm associated with the n-th line in each line group G1 . . . Gm.

Each output of the first column inverter SI1n is connected to the gate of (n−1) further matrix transistors which are associated with those particular lines in each line group G1 . . . Gm, which are still left out by the further matrix transistors controlled by the second column inverters SI2n. In FIG. 2, with respect to the first column inverter SI11 as associated with the first column line 11, these are the matrix transistors T112, T11n; T122, T12n; T132, T13n; T1m2, T1mn. The first column inverter SI12 as associated with the second column line 12, is connected to the gates of the matrix transistors T211, T21n; T221, T22n; T231, T23n; T2m1, T2mn. Finally, the first column inverter SI1n controls the gates of the matrix transistors Tn11, Tn12; Tn21, Tn22; Tn31, Tn32, Tnm1, Tnm2.

Each line Lmn of the matrix M is connected to one of the inputs of the NOR gate N, the output of which controls the enable input Es of the counter Z.

When further pursuing the above-assumed operational case in which the row line 1m and the column line 2n are connected to one another by way of keyboard actuation, then the potential of the zero point of the circuit (=L level) will effect at the input of the first column inverter SI1n, that at the output thereof, there will appear the potential of the operating voltage U (=H level) which, in turn, is inverted into an L level by the second column inverter SI2n.

On the other hand, the H level at the counter reading output 1 of the counter Z is inverted by the row inverter ZI1 into an L level, and the matrix transistors T1mn, T2mn as associated with the resistance element MRmn, are likewise rendered nonconductive by the L levels appearing at the outputs of the first column inverters SI11, SI12, so that the line Lmn conducts an H level.

If now there is simultaneously depressed another pushbutton key of the keyboard TF, for example, the one lying on the left next to the described one in the righthand lower corner of the keyboard TF, hence when additionally also the row line 1m and the column line 22 are connected to one another, then also at the input of the first column inverter SI12 there will appear an L level, and a H level will appear at the output thereof, so that the matrix transistor T2mn is driven into saturation and the line Lmn will assume an L level. Accordingly, all lines of the matrix M have reassumed the initial L level, from which there easily results a faulty-operation supervision in the sense of a protection against multiple actuation.

The H level as appearing on the line Lmn in response to the aforementioned key actuation, moreover, also leads at the output of the NOR gate N, to an L level which serves to stop the counter Z.

In the example of embodiment as shown in FIG. 1, all row transistors ZTm and the matrix transistors T . . . are shown to be insulated-gate field-effect transistors, with this possibility of realization according to the invention being of a particular advantage. In this case, of course, also the first and the second resistance elements SRn, MRmn are realized wih the aid of insulated-gate field effect transistors. It is of a particular advantage, on the one hand, to design the insulated-gate field-effect transistors and the switching transistors of the existing inverters, serving as the row and the matrix transistors, as n-channel enhancement type transistors and, on the other hand, to design the load elements of the inverters and the resistance elements as n-channel depletion type transistors. In that case, the gates of the last-mentioned transistors are then connected to the respective inverter outputs.

While the present invention has been disclosed in connection with the preferred embodiment thereof, it should be understood that there may be other embodiments which fall within the spirit and scope of the invention as defined by the following claims.

I claim:

1. An integrated circuit for electronic keyboard apparatus, said keyboard apparatus comprising a plurality of pushbutton keys each having a pair of contacts, said contacts being connected in a matrix array such that a first one of each of said pair of contacts is connected to one of n first column lines and that the other one of each of said pair of contacts is connected to one of m row lines so that when one of said pushbutton keys is operated the one first column line and the one row line connected to said pushbutton key are directly connected together, said integrated circuit comprising:

n first inverters each having its input connected to one of said n first column lines and to an operating potential via one of a plurality of first resistors;

m row transistors, each of said row transistors having its controlled current path permanently connected to one of said row lins and to the zero point of said circuit;

a clock pulse generator;

a counter havng a count input coupled to said clock pulse generator, having m count outputs and adapted to cyclically count to m, and further having an enable input;

each of said row transistors having its gate connected to one of said m count outputs;

m row inverters each having its input connected to one of said m count outputs;

a matrix comprising a plurality of column lines arranged as m line groups of n lines each, a 1-ex-m-times-n code appearing at said plurality of column lines a plurality of second resistances each having one end connected to said operating potential and each having its other end connected to a different one of said n column lines of said line groups;

said matrix comprising a plurality of matrix transistors each having one end of its controlled current path connected to said zero point of said circuit and each having the other end of its controlled current path connected to a different one of said second resistances, said plurality of matrix transistors being arranged as m groups of transistors, all of the matrix transistors of each group having their control terminals commonly connected, each group of transistors having its commonly connected control terminals connected to the output of a different one of said row inverters;

a plurality of second transistors each having its current controlled path connected between one of said column lines and said zero point of said circuit, said second transistors being arranged in a matrix arrangement having n pairs of row lines, said second transistors of a first one of each of said pairs of row lines each being connected to a corresponding column line in a different one of said line groups with said second transistors in different ones of said first one row lines being connected to different corresponding column lines in said line groups, said second transistors of the other one of each said pair of row lines being connected to the ones of said column lines that are not connected to said second transistors of said first one of said pair of row lines;

each of said first column inverters having its output connected to the control terminals of said second transistors which are in one of said other one of each of said pair of row lines;

n second column inverters each having its input connected to the output of a corresponding one of said first column inverters and having its output connected to the control terminals of said second matrix transistors which are in said first one row line of the pair of row lines having its said other one of said pair of row lines coupled to said corresponding one of said first column inverters;

logic gate means having inputs coupled to all of said column lines and for providing a logic nor function or its equivalent and for generating a signal at an output coupled to said enable input of said counter.

2. An integrated circuit in accordance with claim 1 wherein:

each of said row transistors, each of said matrix transistors and each of said second transistors is an insulated gate field effect transistor.

* * * * *